(12) United States Patent
Joffe et al.

(10) Patent No.: US 7,262,664 B1
(45) Date of Patent: Aug. 28, 2007

(54) CIRCUIT AND METHOD FOR CONTROLLING QUIESCENT CURRENT OF AN AMPLIFIER

(75) Inventors: Daniel M. Joffe, Owens Crossroads, AL (US); Paul Calvin Ferguson, Harvest, AL (US)

(73) Assignee: Adtran, Inc., Huntsville, AL (US)

( * ) Notice: Subject to any disclaimer, the term of this patent is extended or adjusted under 35 U.S.C. 154(b) by 87 days.

(21) Appl. No.: 11/143,061

(22) Filed: Jun. 2, 2005

(51) Int. Cl.
*H03F 3/45* (2006.01)

(52) U.S. Cl. ..................................... 330/260
(58) Field of Classification Search ......... 330/252–261
See application file for complete search history.

(56) References Cited

U.S. PATENT DOCUMENTS

| | | | |
|---|---|---|---|
| 4,857,861 A | 8/1989 | Seevinck et al. | |
| 5,428,316 A | 6/1995 | Molnar | |
| 5,689,211 A | 11/1997 | Embree | |
| 6,281,751 B1* | 8/2001 | Maulik | 330/255 |
| 6,556,081 B2 | 4/2003 | Muza | |
| 6,603,356 B1 | 8/2003 | Kim et al. | |
| 6,825,721 B2* | 11/2004 | Sanchez et al. | 330/253 |

OTHER PUBLICATIONS

You, et al., "Low-Voltage Class *AB* Buffers with Quiescent Current Council," Department of Electrical Engineering, Texas A&M University, Oct. 27, 1997.

* cited by examiner

*Primary Examiner*—Robert Pascal
*Assistant Examiner*—Hieu Nguyen
(74) *Attorney, Agent, or Firm*—Thomas, Kayden, Horstemeyer, & Risley, L.L.P.

(57) ABSTRACT

Typical amplifier circuits used to implement various type of power amplifiers, including line drivers, are capable of supplying high output currents while maintaining a low standby current. Variation in the manufacturing process, however, can lead to large variations in quiescent current of the amplifier. In particular, transistor mismatch and input offset voltage can cause the quiescent current to be very inconsistent from chip to chip. An amplifier in accordance with the present disclosure uses a transconductance amplifier to stabilize the quiescent current. The transconductance amplifier reduces the gain of the amplifier's input stage for very small signals such as the input offset voltage. The transconductance amplifier saturates for input signals larger than the expected offset voltage, allowing the normal high gain of the input stage to amplify the signal without significant gain reduction.

27 Claims, 9 Drawing Sheets

FIG. 1

(Prior Art)

CIRCUIT AND METHOD FOR CONTROLLING QUIESCENT CURRENT OF AN AMPLIFIER

RELATED ART

A complementary metal-oxide semiconductor (CMOS) amplifier is a well known device used to provide a voltage or current gain to an input signal. The current used by an amplifier typically has two components, a signal current component and a quiescent current component. The signal current component is generated in response to the amplified input signal. The quiescent current component refers to the current that is used by the amplifier irrespective of whether the amplifier is receiving an input signal. When the amplifier is in a quiescent state or, in other words, the input signal is near zero, the signal current component goes to near zero, and the total current used by the amplifier is, therefore, largely quiescent current. Thus, an amplifier's quiescent current can be measured by simply taking a measurement of the output current of the amplifier while it is in a quiescent (no-signal) state.

The quiescent current used by an amplifier can have a significant effect on the amplifier's performance. In this regard, a high quiescent current wastes power and reduces the amplifier's efficiency. Reducing quiescent current, therefore, can improve efficiency and conserve power, but setting the quiescent current too low can increase the effects of crossover distortion. Further, if the quiescent current turns completely off, the amplifier can become unstable and unpredictable. Moreover, balancing the tradeoffs between low distortion and low quiescent current is a critical aspect of an amplifier design.

Further, one measure of amplifier performance is the ratio of peak current to quiescent current, and having a low quiescent current generally improves such a ratio. For most amplifiers, a small but stable quiescent current is highly desirable. Unfortunately, transistor mismatches within the amplifier can drastically affect the quiescent current. In this regard, transistor mismatches can create an offset voltage at the input stage of an amplifier, and this offset voltage is magnified by the amplifier's gain such that small random changes in this offset voltage result in large current fluctuations at the amplifier's output stage.

To compensate for the effects of the offset voltage, the gain of the amplifier can be reduced to keep the output current fluctuations within a desired range. However, lowering the gain of the amplifier reduces its performance. In particular, lowering amplifier gain typically decreases the peak available output current and can increase distortion.

It is possible to also compensate for the effects of the offset voltage by increasing quiescent current such that the random variation in output current caused by fluctuations in the offset voltage is a small percentage of the quiescent current. However, as described above, increasing quiescent current undesirably degrades efficiency.

Moreover, better amplifier circuits for reducing the effects of the offset voltage without significantly sacrificing performance are generally desirable.

SUMMARY OF THE DISCLOSURE

Generally, embodiments of the present disclosure pertain to power amplifiers that are capable of controlling quiescent current for providing improved quiescent current characteristics.

A power amplifier in accordance with an exemplary embodiment of the present disclosure comprises an input stage, a transconductance amplifier, and an output stage. The input stage is configured to receive a differential input signal, and the transconductance amplifier is coupled to the input stage. Further, an output stage is coupled to the transconductance amplifier and to the input stage.

In one exemplary embodiment, while the power amplifier is in a quiescent state, the transconductance amplifier sources or sinks current to reduce the gain of the power amplifier thereby reducing fluctuations in the quiescent current due to an offset voltage at the input of the power amplifier. When the power amplifier is receiving a large input differential signal and is not in a quiescent state, the transconductance amplifier saturates so that the gain of the power amplifier is substantially unaffected by the transconductance amplifier. Accordingly, more desirable quiescent current characteristics are achieved without a significant sacrifice to performance.

A method in accordance with an exemplary embodiment of the present disclosure comprises the steps of: providing a power amplifier, the power amplifier having a transconductance amplifier; reducing a gain of the power amplifier while the power amplifier is in a quiescent state, wherein the reducing step comprises the steps of sinking current via the transconductance amplifier in response to a first offset voltage at an input of the power amplifier and sourcing current via the transconductance amplifier in response to a second offset voltage at the input of the power amplifier; receiving an input signal at the input of the power amplifier; and saturating the transconductance amplifier in response to the input signal.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

The present disclosure relates to amplifiers that provide relatively stable quiescent current while maintaining relatively high signal gains and peak to quiescent current ratios as compared to conventional amplifiers. An amplifier circuit in accordance with at least one embodiment of the present disclosure has an input stage and a current mirror stage and incorporates a transconductance amplifier between these stages. The transconductance amplifier uses negative feedback to reduce variations in the quiescent current. In addition, the transconductance amplifier significantly reduces the amplifier circuit's gain for small inputs and offset voltages but allows the amplifier circuit to maintain a relatively high gain for large inputs. Therefore, better quiescent current characteristics can be obtained without significantly sacrificing performance.

Figure 1:
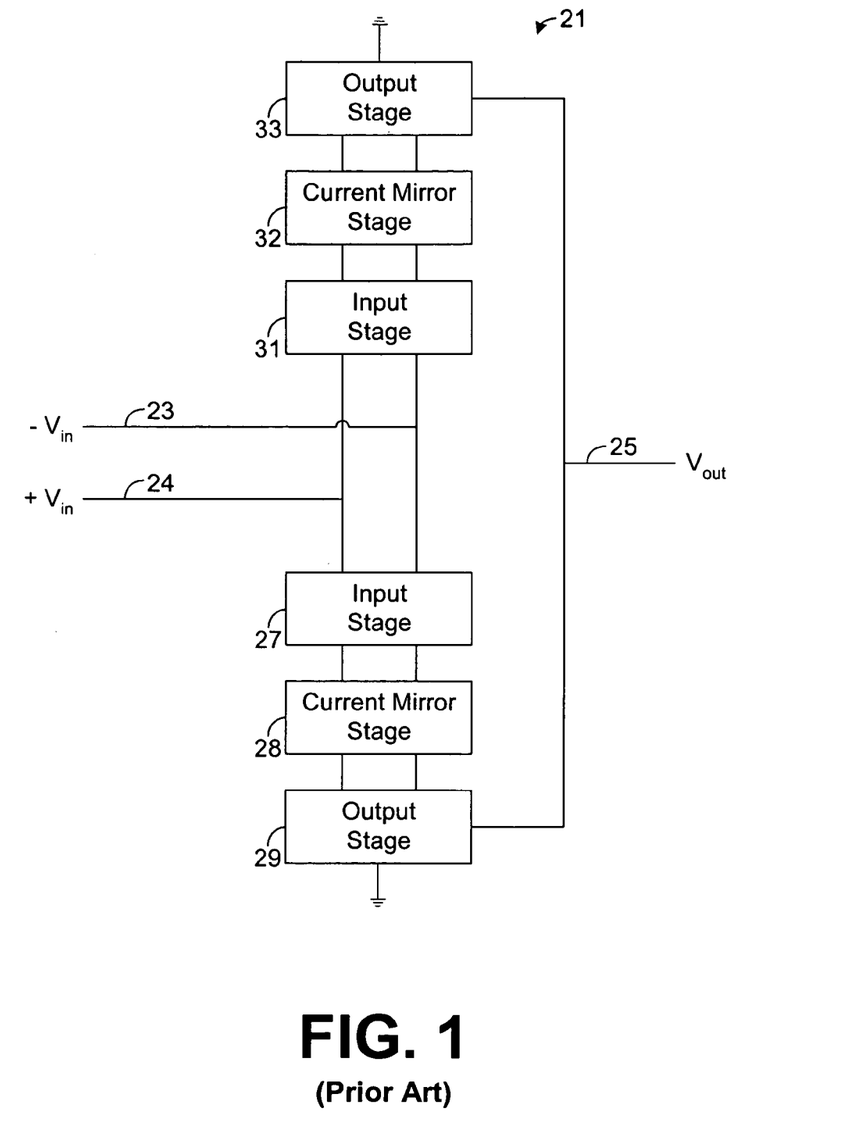
FIG. 1 is a block diagram illustrating a conventional power amplifier.

FIG. 1 depicts a circuit 21 for a conventional complimentary metal-oxide semiconductor (CMOS) power amplifier. As shown by FIG. 1, the circuit 21 has two input connections 23 and 24 for receiving a differential voltage input, negative (−) $V_{in}$ and positive (+) $V_{in}$. The circuit 21 also has an output connection 25 for providing an output voltage ($V_{out}$). The circuit 21 amplifies the differential input voltage such that the output voltage has a significant gain relative to the differential input voltage.

As further shown by FIG. 1, the amplifier circuit 21 has an input stage 27, a current mirror stage 28, and an output stage 29. The stages 27-29 sink output current. To source output current, the amplifier circuit 21 has an input stage 31, a current mirror stage 32, and an output stage 33, which essentially mirror stages 27-29, as will be described in more detail hereafter.

Figure 2:
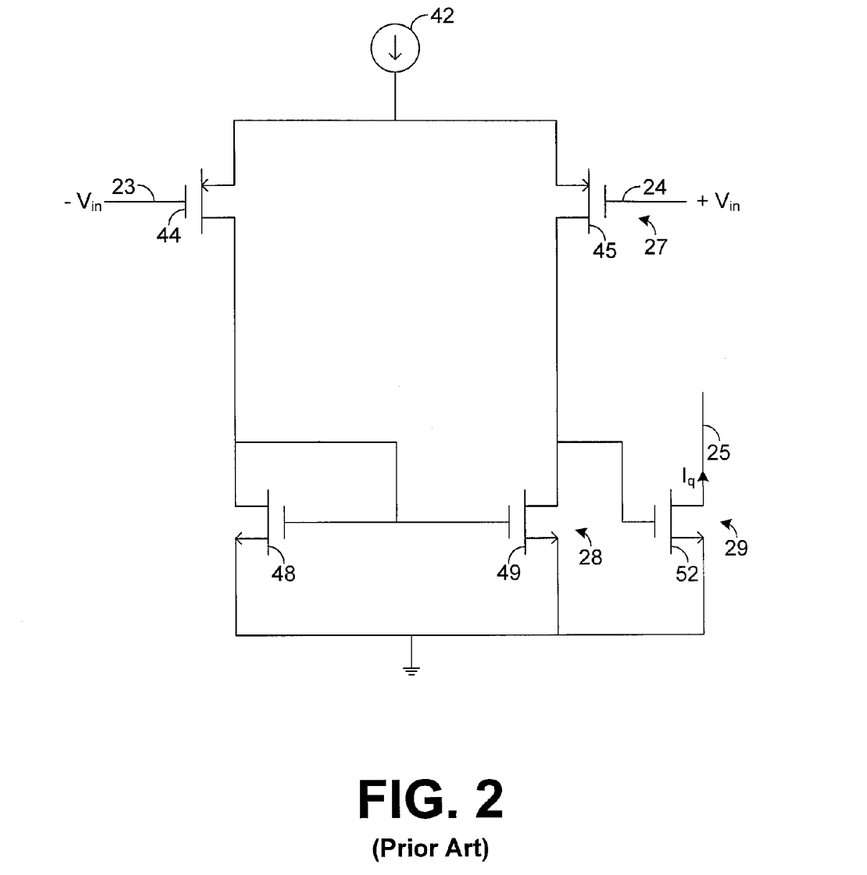
FIG. 2 is a circuit diagram illustrating a portion of the conventional power amplifier of FIG. 1.

FIG. 2 depicts a more detailed view of the stages 27-29 that amplify positive input signals. As shown by FIG. 2, a current source 42 supplies bias current to input stage 27. The input stage 27 comprises a pair of p-type transistors 44 and 45, collectively referred to as a "differential input pair," that receive input signals for amplification by the circuit 60. The current mirror stage 28 comprises a pair of n-type transistors 48 and 49, and the output stage 29 comprises an n-type transistor 52. Stage 28 is a "current mirror" in that the same amount of current ideally flows through each of the transistors 48 and 49. The output stage 29 outputs amplified signals from the circuit 21. The configuration of the stages 31-33 (FIG. 1) is essentially the same as the configuration of the stages 27-29 except that the transistors (not shown) of the input stage 31 are n-type and the transistors (not shown) of the current mirror stage 32 and the output stage 33 are p-type.

Ideally, the differential input transistors 44 and 45 are of the same size, and there is no mismatch between these transistors 44 and 45. Thus, the same amount of current flows through both transistors 44 and 45. In addition, the voltages of the gates of the current mirror transistors 48 and 49 are the same, and the same current ideally flows through both transistors 48 and 49. Thus, the current through the output transistor 52 will be according to the ratio of the sizes of transistors 49 and 52. For example, if output transistor 52 is one-hundred (100) times larger than current mirror transistor 49, then the current through the transistor 52 will ideally be one-hundred (100) times larger than the current through transistor 49.

However, imperfections in manufacturing the differential input transistors 44 and 45 typically create a threshold voltage mismatch between these transistors 44 and 45 such that there is a small voltage difference, referred to as the "offset voltage," between the gate of transistor 44 and the gate of transistor 45. Thus, less current flows through one of the transistors 44 and 45. For example, assume that due to the mismatch between the differential input transistors 44 and 45, more current flows through transistor 45 as compared to transistor 44. Since transistors 48 and 49 are usually closely matched and there is less current passing through transistor 48, there is less current pulled down by transistor 49 as compared to the ideal case described above with no mismatch between transistors 44 and 45. Therefore, the voltage of the gate of transistor 52 is higher than in the ideal case.

Noting that the output stage 29 is a high gain stage, even small increases in the voltage of the gate of transistor 52 result in significant increases in the current output by the output transistor 52. Thus, a relatively small mismatch between the differential pair transistors 44 and 45 undesirably results in a relatively large increase in the quiescent current output from the transistor 52. Further, small fluctuations in the output offset voltage result in large fluctuations in the output quiescent current ($I_q$) thereby undesirably decreasing the stability of the output quiescent current.

Figure 3:
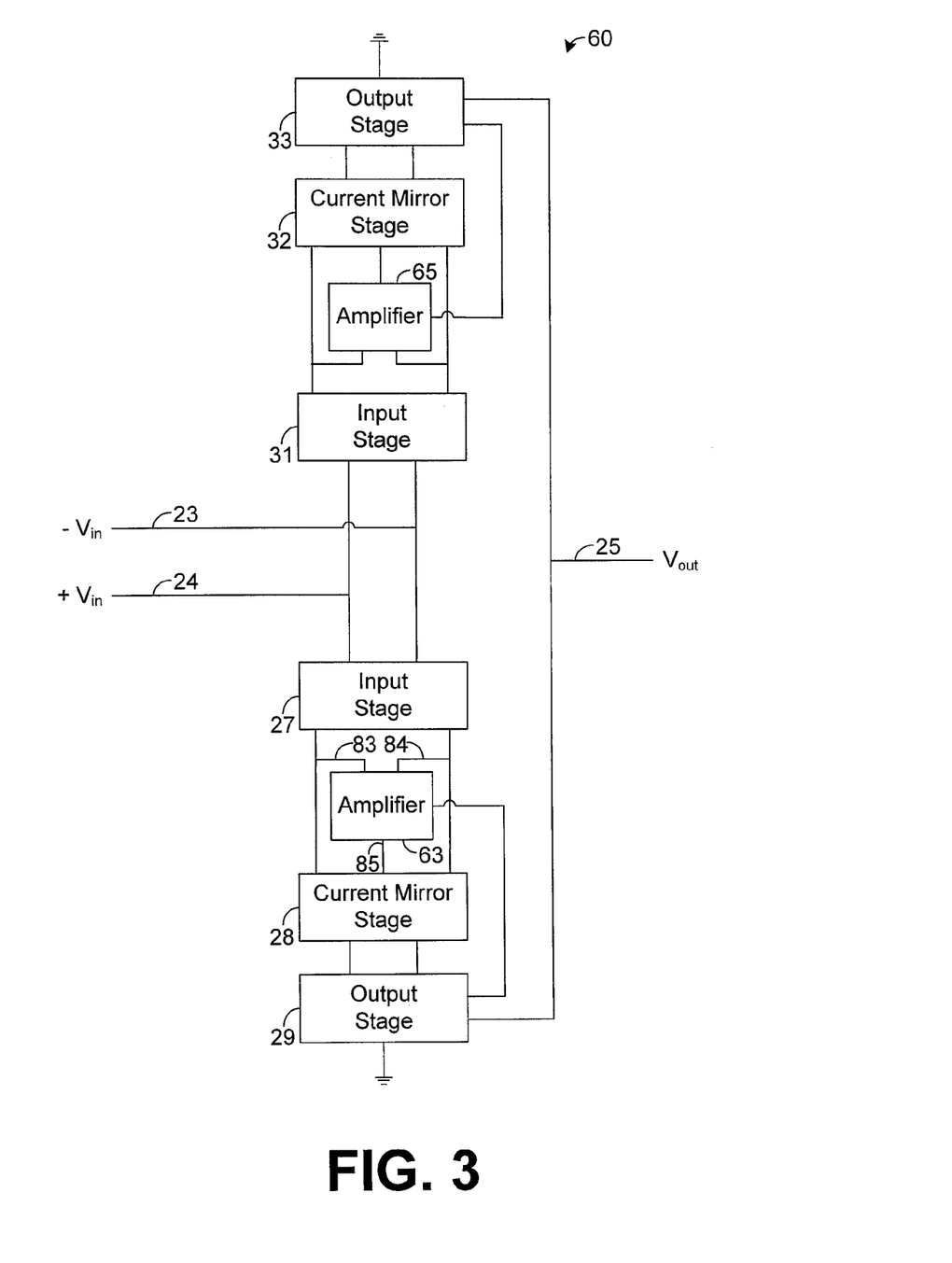
FIG. 3 is a block diagram illustrating a power amplifier in accordance with an exemplary embodiment of the present disclosure.

FIG. 3 depicts a circuit 60 for a CMOS power amplifier in accordance with an exemplary embodiment of the present disclosure. As can be seen by comparing FIG. 3 to FIG. 1, the amplifier circuit 60 may be similar to the conventional amplifier circuit 21 except that the circuit 60 comprises a transconductance amplifier 63 between the input stage 27 and the current mirror stage 28 and a transconductance amplifier 65 between the input stage 31 and the current mirror stage 32.

Note that the operation and configuration of the transconductance amplifier 63 within the stages 27-29 for amplifying positive input signals is similar to the operation and configuration of the transconductance amplifier 65 within the stages 31-33 for amplifying negative input signals. Thus, for brevity purposes, exemplary operations and configurations of the transconductance amplifier 63 and stages 27-29 will be described hereafter in detail with less emphasis on the possible operations and configurations of the transconductance amplifier 65 and stages 31-33. However, it is to be understood that teachings relating to the amplifier 63 and stages 27-29 may similarly be applied to the transconductance amplifier 65 and the stages 31-33.

Figure 4:
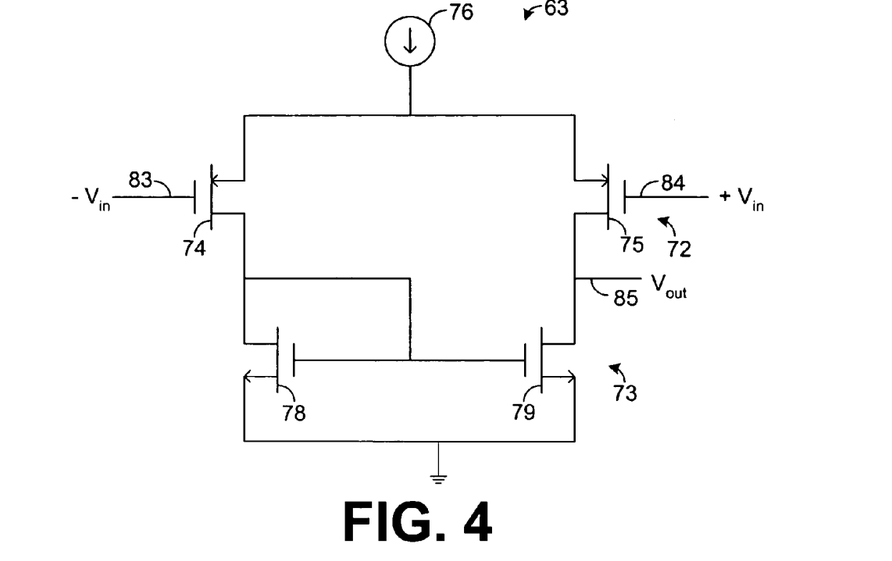
FIG. 4 is a circuit diagram illustrating an exemplary embodiment of a transconductance amplifier depicted in FIG. 3.

Various types of transconductance amplifiers exist in the art, and any known or future-developed transconductance amplifier may be used to implement the amplifier 63 of FIG. 3. FIG. 4 depicts an exemplary transconductance amplifier 63 that may be used in at least one embodiment of the present disclosure.

As shown by FIG. 4, the transconductance amplifier 63, similar to the amplifier circuit 21 shown by FIG. 1, has an input stage 72 and a current mirror stage 73. The input stage 72 comprises a differential input pair of p-type transistors 74 and 75, and the current mirror stage 73 comprises a pair of n-type transistors 78 and 79. The sources of the differential input transistors 74 and 75 are both coupled to a current source 76, and the drain of the differential input transistor 74 is coupled to the drain and gate of the current mirror transistor 78. The drain of transistor 74 is also coupled to the gate of the other current mirror transistor 79. In addition, the drain of the differential input transistor 75 is coupled to the drain of the current mirror transistor 79, and the sources of the current mirror transistors 78 and 79 are both coupled to ground. The gate of the transistor 74 is coupled to a negative input connection 83, and the gate of the transistor 75 is coupled to a positive input connection 84. Further, the drains of transistors 75 and 79 are both coupled to an output connection 85. Note that the configuration of the amplifier 65 (FIG. 3) can be essentially the same as the configuration of the amplifier 63 of FIG. 4 except that the differential input pair transistors (not shown) of amplifier 65 are n-type and the current mirror transistors (not shown) of amplifier 65 are p-type.

Figure 5:
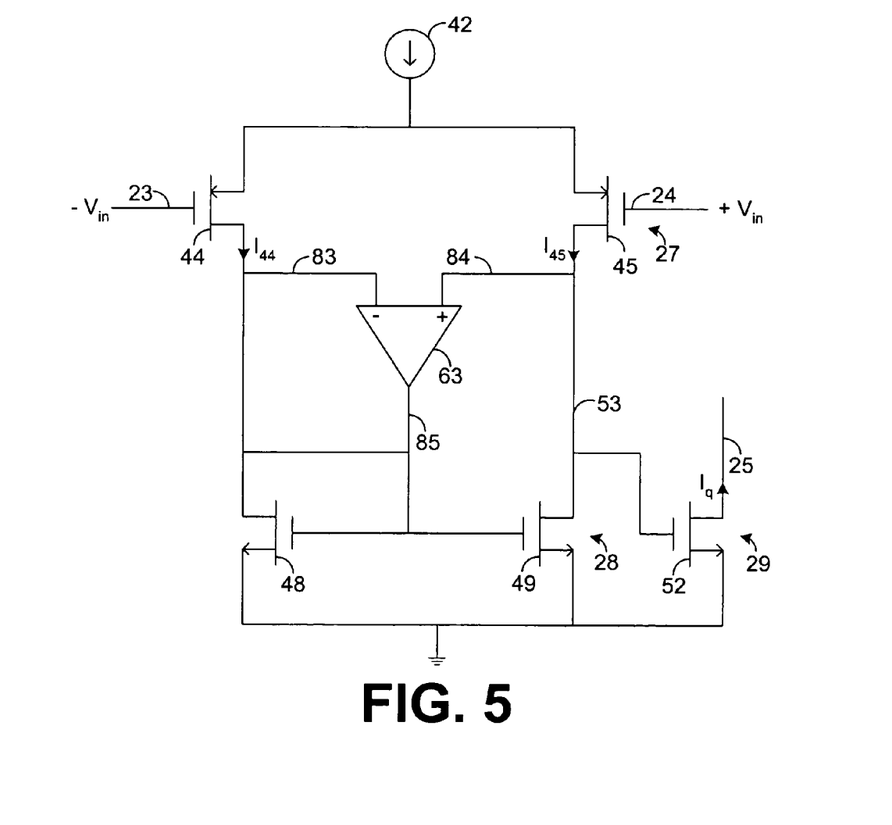
FIG. 5 is a circuit diagram illustrating an exemplary embodiment of a portion of the power amplifier depicted in FIG. 3 for sinking output current.

FIG. 5 depicts an exemplary embodiment of the stages 27-29 and the transconductance amplifier 63 of the amplifier circuit 60 depicted in FIG. 3. As shown by FIG. 5, the current source 42 is coupled to the sources of the differential input transistors 44 and 45. The input connection 23 providing $-V_{in}$ is coupled to the gate of the differential input transistor 44, and the input connection 24 providing $+V_{in}$ is coupled to the gate of differential input transistor 45. In addition, the drain of the differential input transistor 44 is coupled to the drain and gate of the current mirror transistor 48. The drain of the differential input transistor 44 is also coupled to the input connection 83 and the output connection 85 of the transconductance amplifier 63, as well as to the gate of the current mirror transistor 49. The drain of the differential input transistor 45 is coupled to the input connection 84 of the transconductance amplifier 63 and to the drain of the current mirror transistor 49. The drain of the differential input transistor 45 is also coupled to the gate of the output transistor 52. In addition, the sources of the current mirror transistors 48 and 49, as well as the output transistor 52, are all coupled to ground.

The offset voltage due to a mismatch of the differential input transistors 44 and 45 causes a differential voltage to exist at the input of the transconductance amplifier 63. For example, assume that, while the circuit 60 is in a quiescent state, more current flows through the differential input transistor 45 as compared to the other differential input transistor 44. In other words, if $I_{44}$ represents the current flowing through the transistor 44 and $I_{45}$ represents the current flowing through transistor 45, assume that $I_{45}$ is greater than $I_{44}$ while the circuit 60 is in a quiescent state. In such a case, the gate voltage of the output transistor 52 increases due to the higher current $I_{45}$ and lower current $I_{44}$. Therefore, the magnitude of the positive input voltage (i.e., the voltage of connection 84) of the amplifier 63 increases above the magnitude of the negative input voltage (i.e., the voltage of connection 83) of the amplifier 63. Such a differential voltage at the input of the amplifier 63 causes the amplifier 63 to source current such that current flows out of the amplifier 63 via connection 85.

The current sourced by the amplifier 63, referred to as $I_{out}$, flows through the current mirror transistor 48 along with the current flowing through the input differential transistor 44. Indeed, since the transconductance amplifier 63, by definition, has a high impedance, the current flowing through the current mirror transistor 48 is approximately equal to $I_{44}+I_{out}$. Moreover, the sourcing of current $I_{out}$ by the amplifier 63 helps to compensate for the fact that $I_{44}$ is reduced due to the offset voltage at the input of the amplifier circuit 60. In particular, the additional current provided by the amplifier 63 increases the total current flowing through the current mirror transistor 48.

Further, the sourcing of current $I_{out}$ by the amplifier 63 increases the gate voltages of current mirror transistors 48 and 49. The increase in the gate voltage of the current mirror transistor 49 causes this transistor 49 to pull down harder thereby compensating for the fact that $I_{45}$ is increased due to the offset voltage. In particular, increasing the gate voltage of the current mirror transistor 49 causes more current to flow through this transistor 49 and reduces the gate voltage of the output transistor 52. Thus, while the increase in $I_{45}$ due to the offset voltage tends to increase the gate voltage of the output transistor 52, the current sourcing of the amplifier 63 tends to counteract such a voltage increase. Thus, the sourcing of current by the amplifier 63 effectively reduces the gain of the amplifier circuit 60 for a positive offset voltage. In this regard, the gain of the amplifier circuit 60 can be expressed as follows for both positive and negative offset voltages.

$$\text{Gain} = \frac{Vgout}{Vin} = \frac{-1}{2} \cdot gm44 \cdot \frac{gmt + 2 \cdot gm48}{gm48 \cdot gmt + gL \cdot gmt + gL \cdot gm48} \quad \text{Eqtn. (1)}$$

"$V_{gout}$" represents the gate voltage of the output transistor 52 (i.e., the voltage of node 53), and "$V_{in}$" represents the voltage differential at the input of the circuit 60 (i.e., across connections 23 and 24). Further, "gm44" represents the transconductance of the differential transistor 44, and "gm48" represents the transconductance of the current mirror transistor 48. In addition, "gmt" represents the transconductance of the amplifier 63, and "gL" represents the output conductance loading the node 53.

Now assume that, due to the offset voltage, more current flows through the differential input transistor 44 as compared to the other differential input transistor 45 while the circuit 60 is in a quiescent state. In other words, assume that $I_{44}$ is greater than $I_{45}$ while the circuit 60 is in a quiescent state. In such a case, the gate voltage of the output transistor 52 (i.e., the voltage of node 53) decreases due to the lower current $I_{45}$. Therefore, the magnitude of the positive input voltage (i.e., the voltage of connection 84) of the amplifier 63 decreases below the magnitude of the negative input voltage (i.e., the voltage of connection 83) of the amplifier 63. Such a differential voltage at the input of the amplifier 63 causes the amplifier 63 to sink current such that current flows into the amplifier 63 via connection 85.

The sinking of current by the amplifier 63 reduces the current flowing through the current mirror transistor 48. Thus, the sinking of current by the amplifier 63 helps to compensate for the fact that $I_{44}$ is increased due to the offset voltage caused by the differential input mismatch.

Further, the sinking of current by the amplifier 63 helps to counteract the reduction in the gate voltage of the output transistor 52. In this regard, the sinking of current by the amplifier 63 reduces the gate voltage of the current mirror transistor 49. Thus, less current flows through the transistor 49, and the gate voltage of the output transistor 52 increases. This voltage increase counteracts the voltage decrease of the node 53 due to the reduction in $I_{45}$ resulting from the offset voltage. Thus, the sinking of current by the amplifier 63 effectively reduces the gain of the amplifier circuit 60 for a negative offset voltage.

Therefore, despite fluctuations in the offset voltage, the gate voltage of the output transistor 52 and the output quiescent current remain relatively constant due to the negative feedback provided by the transconductance amplifier 63. Thus, the presence of the transconductance amplifier 63 helps to stabilize the quiescent current.

In a preferred embodiment, the transconductance amplifier 63 is configured to saturate when the differential input voltage of the amplifier circuit 60 (i.e., the voltage difference of connections 23 and 24) exceeds a threshold. Once the amplifier 63 saturates, it is unable to source more current (in the case when the magnitude of the positive input voltage on connection 84 is greater than the magnitude of the negative input voltage on connection 83) or sink more current (in the case when the magnitude of the positive input voltage on connection 84 is less than the magnitude of the negative input voltage on connection 83). The threshold is preferably established via the configuration of the amplifier 63 such that the threshold is greater than the expected differential input voltages across connections 23 and 24 when the circuit 60 is in a quiescent state but much less than the expected differential input voltages across connections 23 and 24 when the circuit 60 is not in a quiescent state (i.e., when the circuit 60 is receiving an input signal via connections 23 and 24).

Thus, when the circuit 60 is in a quiescent state, the transconductance amplifier 63 helps to stabilize the quiescent current. In this regard, the transconductance amplifier 63, as described above, sufficiently sources or sinks current to reduce the gain of the amplifier circuit 60 so that a random fluctuation in the input differential voltage does not result in a significant fluctuation in the output quiescent current.

However, when the circuit 60 receives a relatively large input signal via connections 23 and 24 such that the circuit 60 is no longer in a quiescent state, the transconductance amplifier 63 saturates and, therefore, has a relatively small effect on the gain of the amplifier circuit 60. Accordingly, the presence of the transconductance amplifier 63 does not significantly reduce the peak output current of the amplifier circuit 60. Thus, improved quiescent current characteristics are achieved without a significant adverse impact to the performance of the amplifier circuit 60.

Figure 6:
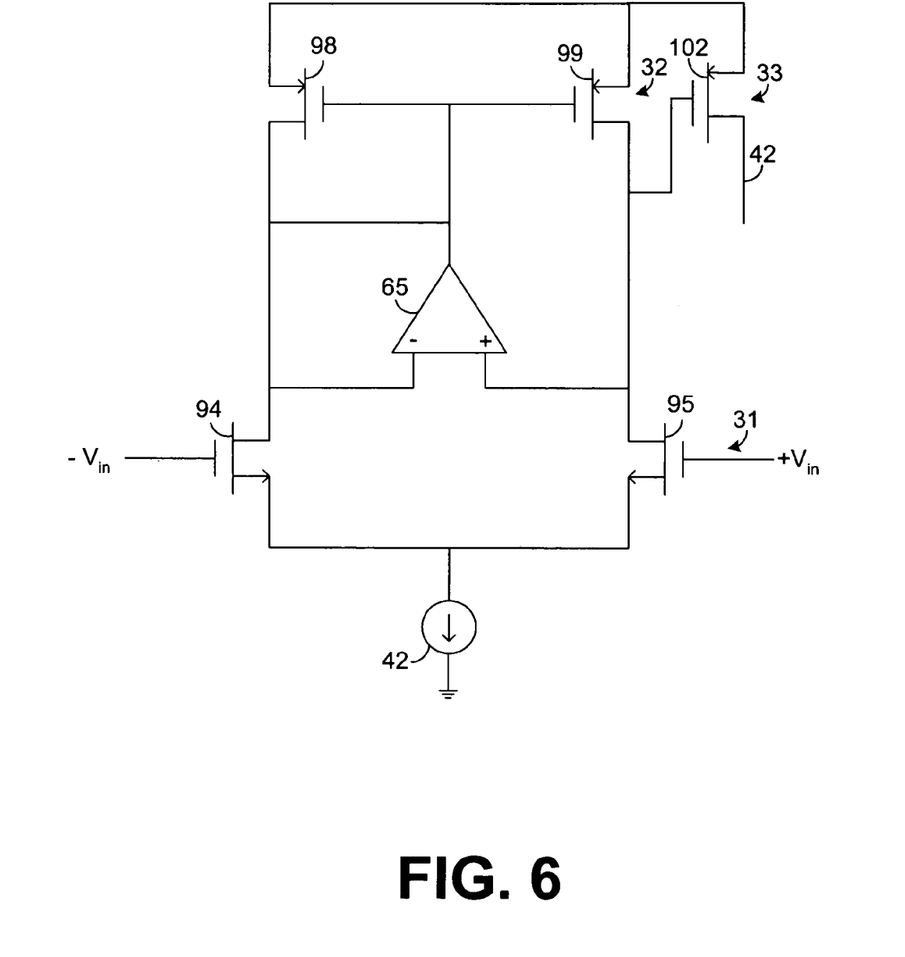
FIG. 6 is a circuit diagram illustrating an exemplary embodiment of a portion of the power amplifier depicted in FIG. 3 for sourcing output current.

FIG. 6 depicts an exemplary embodiment of the stages 31-33 of the amplifier circuit 60 depicted in FIG. 3. As shown by FIG. 6, the input stage 31 comprises a pair of differential input transistors 94 and 95 respectively corresponding to the differential input transistors 44 and 45 of FIG. 5 except that the transistors 94 and 95 are n-type. Further, the current mirror stage 32 comprises a pair of current mirror transistors 98 and 99 respectively corresponding to the current mirror transistors 48 and 49 of FIG. 5 except that the transistors 98 and 99 are p-type. In addition, the output stage 33 comprises an output transistor 102 corresponding with the output transistor 52 of FIG. 5 except that the transistor 102 is p-type. In general, the operation of the stages 31-33 operates essentially the same as the operation described above for stages 27-29 except that stages 31-33 amplify negative input signals rather than positive input signals.

Figure 7:
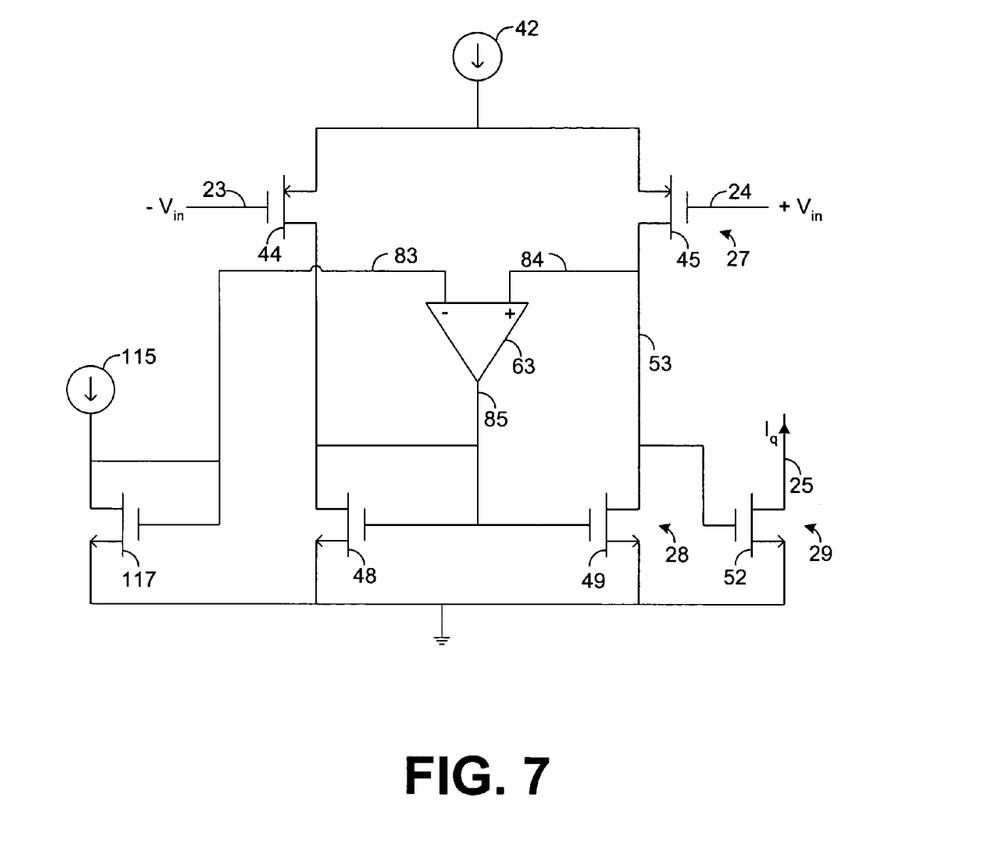
FIG. 7 is a circuit diagram illustrating the power amplifier portion of FIG. 5 as modified to enable a current source to provide independent control of quiescent current thereby enabling optimization of the output quiescent current.

FIG. 7 depicts another exemplary embodiment of the stages 27-29, which enable independent control of quiescent current levels. In this regard, the configuration of the stages 27-29 is identical to that described above with reference to FIG. 5 except that the configuration of FIG. 7 comprises an additional current source 115 and a transistor 117. Further, the negative input connection 83 is coupled to the current source 115 and the drain of the transistor 117 rather than being coupled to the gate and drain of the differential input transistor 44 as is shown by FIG. 5. As shown by FIG. 7, the source of transistor 117 is coupled to ground. In at least one embodiment, the transistor 117 is the same size as the current mirror transistor 48, and the current source 115 initially provides current equal to half of the current that is provided by the current source 42. However, in other embodiments, other sizes of the transistor 117 and values of the current provided by the current source 115 are possible.

The transistor 117 is generally unaffected by any mismatches between the differential input transistors 44 and 45, and the current source 115, therefore, provides a stable reference voltage for the negative input of the transconductance amplifier 63. For the purpose of illustration in the examples described hereafter with respect to FIG. 7, assume that the amplifier 63 is initially in a state of equilibrium such that no current is being sinked or sourced by the amplifier 63 (i.e., the magnitude of the negative input voltage on connection 83 equals the magnitude of the positive input voltage on connection 84).

If the current provided by the current source 115 is increased, the transconductance amplifier 63 will begin to sink current. Therefore, as described above with respect to FIG. 5, the sinking of current by the amplifier 63 will result in less current flowing through the current mirror transistors 48 and 49, and a rise in the gate voltage of the output transistor 52 will occur. Thus, there is an increase in the output quiescent current.

However, if the current provided by the current source 115 is decreased, the transconductance amplifier 63 will begin to source current. Therefore, as described above with respect to FIG. 5, the sourcing of current by the amplifier 63 will result in more current flowing through the current mirror transistors 48 and 49, and a decrease in the gate voltage of the output transistor 52 will occur. Thus, there is a decrease in the output quiescent current.

Accordingly, controlling the current source 115 effectively controls the quiescent current level output by the transistor 52. In particular, increasing the current provided by the current source 115 increases the output quiescent current, and decreasing the current provided by the current source 115 decreases the output quiescent current. Indeed, the effect of the current source 115 within the circuit is shown by the following equation.

$$Vgout = \frac{gmt}{gmt + gL} \cdot Vref - Vin \cdot \frac{gm44}{gmt + gL} \qquad \text{Eqtn. (2)}$$

"$V_{ref}$" represents the reference voltage at the input of the amplifier 63 due to the current supplied by current source 115 (i.e., the voltage of connection 83 in FIG. 7). Note that an independent current source (not shown) and transistor (not shown) may be similarly added to the stages 31-33 depicted by FIG. 6 to enable similar control of the quiescent current output by the transistor 102.

Moreover, the current source 115 may be used to tune the output quiescent current to an optimum level. For example, if the amplifier circuit 60 is to be used in an application requiring fast speeds, then the current provided by the current source 115 may be increased to provide a higher output quiescent current. However, if the amplifier circuit 60 is to be used in an application requiring low power consumption, then the current provided by the current source 115 may be decreased to provide a lower output quiescent current.

Figure 8:
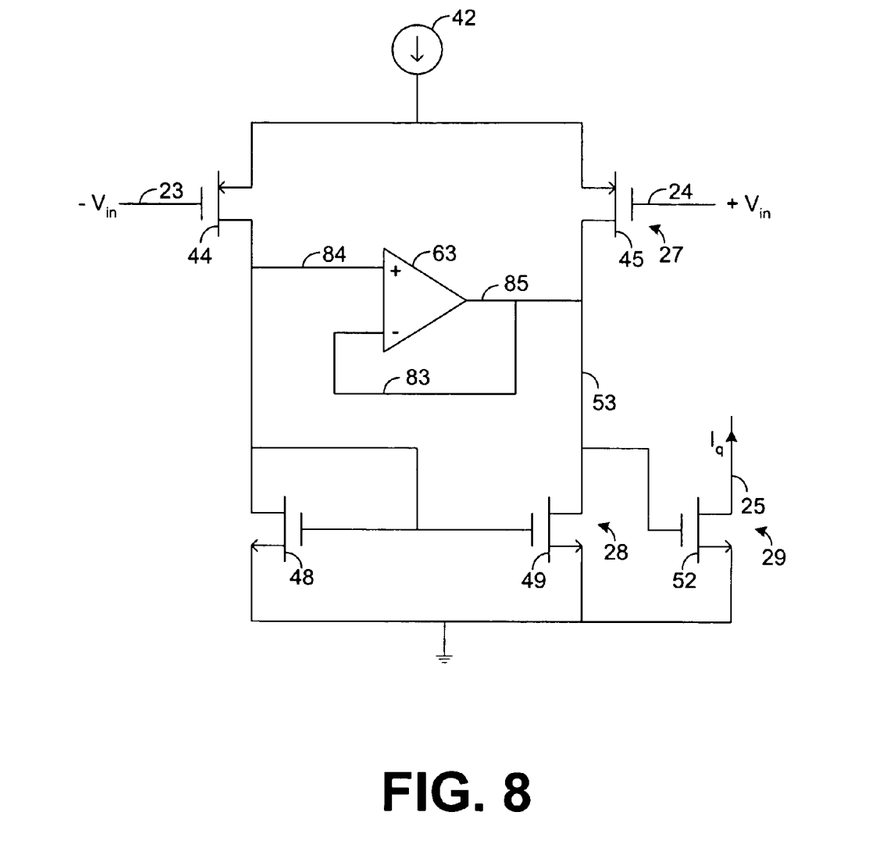
FIG. 8 is a circuit diagram illustrating another exemplary embodiment of the power amplifier portion depicted in FIG. 5.

FIG. 8 depicts another exemplary embodiment of the stages 27-29 shown by FIG. 3. The configuration of the stages 27-29 of FIG. 8 is identical to the configuration shown by FIG. 5 except that the positive input connection 84 is coupled to the drain of the differential input transistor 44 and the negative input connection 83 is coupled to the output connection 85. Further, the output connection 85 is coupled to the drain of the differential input transistor 45.

If a mismatch between the differential input transistors 44 and 45 results in more current flowing through transistor 45 than transistor 44 (i.e., $I_{45}$ is greater than $I_{44}$), then the additional current flowing through the differential input transistor 45 tends to increase the gate voltage of the output transistor 52. As shown by FIG. 8, the gate of transistor 52 is coupled to the negative input of amplifier 63. Therefore, a rise in the gate voltage of the output transistor 52 causes the amplifier 63 to sink current. The sinking of current by the amplifier 63 counteracts the rise in the gate voltage of transistor 52 that is due to the higher current $I_{45}$. In this regard, the sinking of current by the amplifier 63 effectively reduces the gain of the amplifier circuit 60. Accordingly, the rise in the gate voltage of the output transistor 52 is limited by the sinking of current by the transconductance amplifier 63.

If a mismatch between the differential input transistors 44 and 45 results in more current flowing through transistor 44 than transistor 45 (i.e., $I_{44}$ is greater than $I_{45}$), then the gate voltage of the output transistor 52 decreases. However, such a decrease causes the amplifier 63 to begin sourcing current, and the additional current sourced by the amplifier 63 counteracts the reduction in the gate voltage of transistor 52. Accordingly, the reduction in the gate voltage of the output transistor 52 is limited by the sourcing of current by the transconductance amplifier 63.

Therefore, as in the embodiment shown by FIG. 5, the transconductance amplifier shown by FIG. 8, adaptively adjusts the gain of the amplifier circuit 60 such that the output quiescent current is relatively constant. However, as described above with reference to FIG. 5, the transconductance amplifier 63 is preferably configured to saturate when its differential input voltage across connections 83 and 84 reaches a threshold. Therefore, the effects of the transconductance amplifier 63 of FIG. 8, like the effects of the transconductance amplifier 63 of FIG. 5, are significant when the circuit 60 is in a quiescent state but are relatively insignificant when the circuit 60 is not in a quiescent state (i.e., receiving a relatively large input signal across connections 23 and 24). Accordingly, better quiescent current characteristics are achieved without a significant adverse effect to the performance of the circuit 60.

Figure 9:
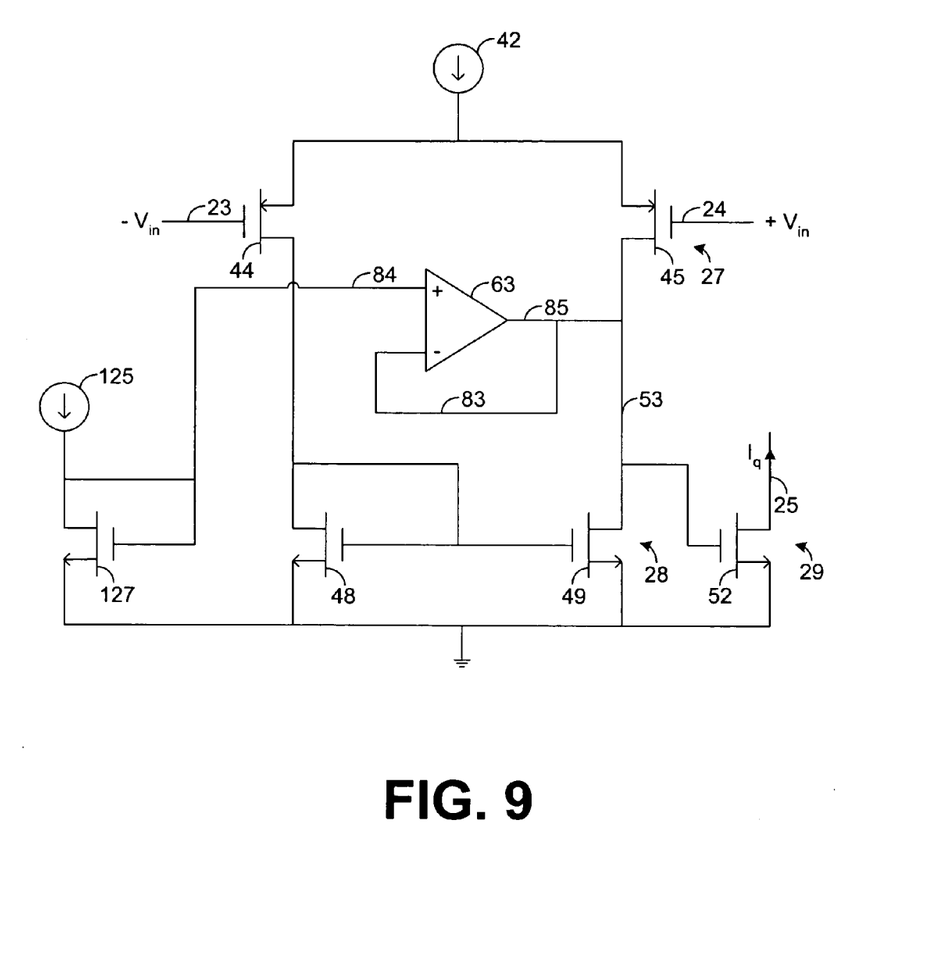
FIG. 9 is a circuit diagram illustrating the power amplifier portion of FIG. 8 as modified to enable a current source to provide independent control of quiescent current thereby enabling optimization of the output quiescent current.

Further, as described above with reference to FIGS. 5 and 7, an additional current source and transistor may be used to provide independent control of the quiescent current output by the transistor 52 of FIG. 8. Such an embodiment is depicted by FIG. 9. In this regard, the configuration depicted by FIG. 9 is identical to the configuration depicted by FIG. 8, except that the configuration of FIG. 9 includes an additional current source 125 and transistor 127. Further, the positive input connection 84 is coupled to the current source 125, as well as the gate and drain of the transistor 127, instead of being coupled to the drain of the differential input transistor 44 as is shown by FIG. 8. The source of the transistor 127 is coupled to ground. In at least one embodiment, the transistor 127 is the same size as transistor 48, and the current source 125 initially provides current equal to half of the current that is provided by current source 42. However, in other embodiments, other sizes of the transistor 127 and values of the current provided by the current source 125 are possible.

Similar to the current source 115 in FIG. 7, current from the current source 115 provides a reference voltage for the transconductance amplifier 63. In particular, such a current provides a stable positive input voltage to the amplifier 63. An increase in the current of the current source 125 causes the amplifier 63 to source more current or sink less current depending on the relationship of the positive and negative input voltages of transconductance amplifier 63. Thus, an increase in the current of the current source 125 increases the gate voltage of the output transistor 52 and, therefore, the output quiescent current.

A decrease in the current of the current source 125, on the other hand, causes the amplifier 63 to sink more current or source less current depending on the relationship of the positive and negative input voltages of transconductance amplifier 63. Thus, a decrease in the current of the current source 125 decreases the gate voltage of the output transistor 52 and, therefore, the output quiescent current output. Moreover, like the current source 115 of FIG. 7, the current source 125 of FIG. 8 may be controlled to control the quiescent current output by the transistor 52.

Figure 10:
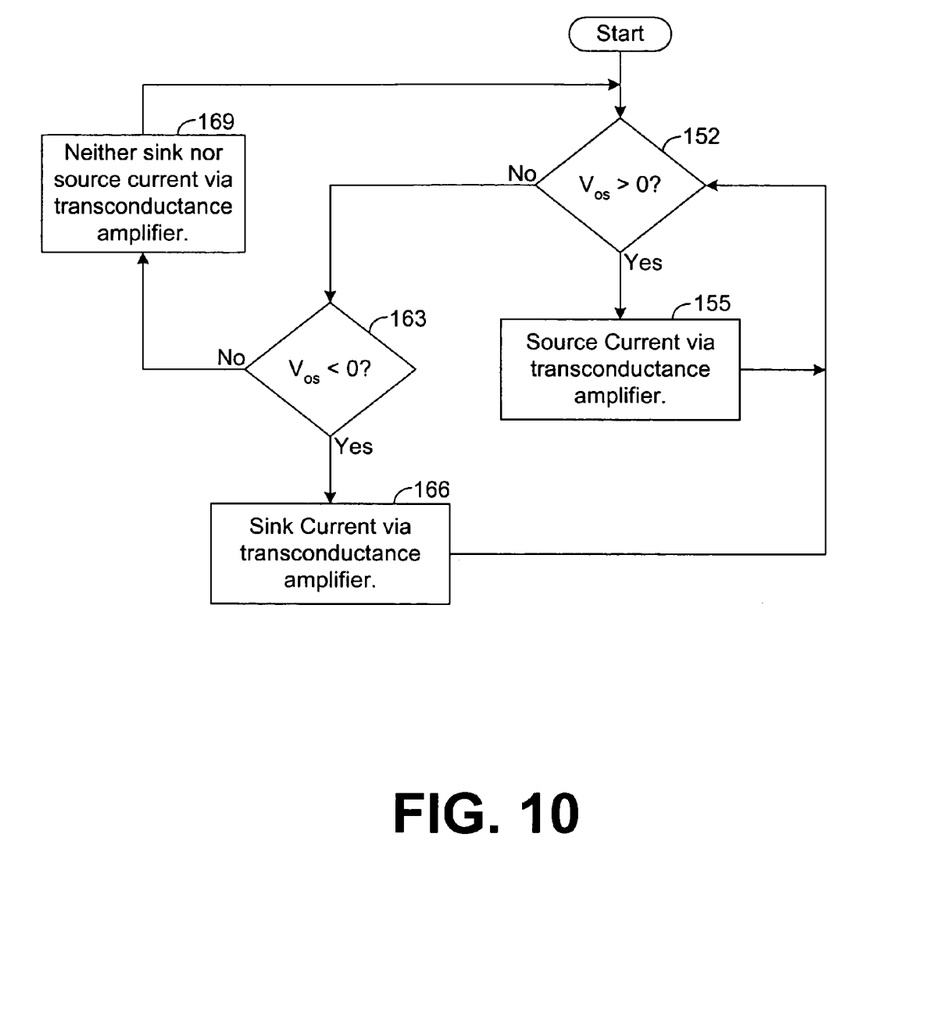
FIG. 10 is a flow chart illustrating an exemplary operation of a transconductance amplifier, such as is depicted by FIG. 4, within a power amplifier, such as is depicted by FIG. 5.

FIG. 10 depicts an exemplary operation of the transconductance amplifier 63 within the amplifier circuit 60 of FIG. 3.

As shown by blocks 152 and 155, the transconductance amplifier 63 sources current if the offset voltage ($V_{os}$) is positive. Therefore, the gate voltage of the transistor 52 is increased such that the output quiescent current remains substantially constant despite a positive fluctuation in the offset voltage assuming that the circuit 60 is in a quiescent state. If the circuit 60 is not in a quiescent state due to a relatively large input signal received at the input of the circuit 60, then amplifier circuit 60 is saturated such that the reduction in the gain of the circuit 60 by amplifier 63 is insignificant.

As shown by blocks 163 and 166, the transconductance amplifier 63 sinks current if $V_{os}$ is negative. Therefore, the gate voltage of the transistor 52 is reduced such that the output quiescent current remains substantially constant despite a negative fluctuation in the offset voltage assuming that the circuit 60 is in a quiescent state. If the circuit 60 is not in a quiescent state due to a relatively large input signal received at the input of the circuit 60, then amplifier circuit 60 is saturated such that the reduction in the gain of the circuit 60 by amplifier 63 is insignificant.

As shown by blocks 152, 163, and 169, the transconductance amplifier 63 neither sinks nor sources current if the voltage offset is equal to zero.

Moreover, by reducing the gain of the amplifier circuit 60 in response to a positive or negative offset voltage, the transconductance amplifier 63 helps to stabilize the output quiescent current while the circuit 60 is in a quiescent state. However, when a relatively large input signal is received by the circuit 60, the transconductance amplifier 63 saturates such that the gain of the amplifier circuit 60 is substantially unaffected by the transconductance amplifier 63. Accordingly, the transconductance amplifier 63 helps to control the quiescent current such that better quiescent current characteristics are achieved without significantly sacrificing performance.

Now, therefore, the following is claimed:

1. A power amplifier, comprising:
   an input stage configured to receive a differential input signal;
   a transconductance amplifier coupled to the input stage, the transconductance amplifier configured to source or sink current if the power amplifier is in a quiescent state thereby reducing a gain of the power amplifier in the quiescent state, the transconductance amplifier further configured to saturate if the transconductance amplifier is in a non-quiescent state; and an output stage coupled to the transconductance amplifier and to the input stage.

2. A power amplifier, comprising:

an input stage configured to receive a differential input signal;

a transconductance amplifier coupled to the input stage, the transconductance amplifier configured to source or sink current such that a gain of the power amplifier is reduced while the power amplifier is in a quiescent state thereby reducing fluctuations in a quiescent current of the power amplifier; and an output stage coupled to the transconductance amplifier and to the input stage.

3. The power amplifier of claim 2, wherein the transconductance amplifier is configured to saturate in response to the differential input signal such that a gain provided by the power amplifier to the differential input signal is substantially unaffected by the transconductance amplifier.

4. The power amplifier of claim 1, further comprising a current mirror stage coupled to the output stage and to the transconductance amplifier.

5. The power amplifier of claim 1, wherein the input stage comprises differential input transistors and the output stage comprises an output transistor.

6. The power amplifier of claim 5, wherein one of the differential input transistors is coupled to a gate of the output transistor, and wherein the one differential input transistor is coupled to the transconductance amplifier.

7. The power amplifier of claim 6, wherein the differential input transistors are coupled to current mirror transistors.

8. The power amplifier of claim 6, wherein the transconductance amplifier comprises an input connection, and wherein the one differential input transistor is coupled to the input connection.

9. The power amplifier of claim 6, wherein the transconductance amplifier comprises an output connection, and wherein the one differential input transistor is coupled to the output connection.

10. The power amplifier of claim 1, wherein the input stage is coupled to a first current source and an input connection of the transconductance amplifier is coupled to a second current source.

11. The power amplifier of claim 1, wherein the transconductance amplifier comprises an input connection, and wherein current received by the transconductance amplifier via the input connection is independent of current received by the input stage.

12. A power amplifier, comprising:

an input stage configured to receive a differential input signal;

a transconductance amplifier coupled to the input stage, the transconductance amplifier configured to saturate such that a gain provided by the power amplifier to an input signal is substantially unaffected by the transconductance amplifier; and an output stage coupled to the transconductance amplifier and to the input stage.

13. The power amplifier of claim 12, wherein the transconductance amplifier is configured to source or sink current such that a gain of the power amplifier is reduced while the power amplifier is in a quiescent state.

14. The power amplifier of claim 12, wherein the transconductance amplifier is configured to source or sink current such that a quiescent current of the power amplifier remains substantially constant while the power amplifier is in a quiescent state.

15. A power amplifier, comprising:

differential input transistors;

an output transistor; and a transconductance amplifier coupled to the differential input transistors and the output transistor, the transconductance amplifier configured to source or sink current while the power amplifier is in a quiescent state thereby reducing a gain of the power amplifier in the quiescent state, the transconductance amplifier further configured to saturate in response to a differential input signal received by the differential input transistors.

16. A power amplifier, comprising:

differential input transistors;

an output transistor; and a transconductance amplifier coupled to the differential input transistors and the output transistor, the transconductance amplifier configured to source or sink current such that a gain of the power amplifier is reduced while the power amplifier is in a quiescent state thereby reducing fluctuations in a quiescent current of the power amplifier.

17. The power amplifier of claim 16, wherein the transconductance amplifier is configured to saturate in response to a differential input signal received by the differential input transistors such that a gain provided by the power amplifier to the differential input signal is substantially unaffected by the transconductance amplifier.

18. A method, comprising the steps of:

providing a power amplifier, the power amplifier having a transconductance amplifier;

reducing a gain of the power amplifier while the power amplifier is in a quiescent state, wherein the reducing step comprises the steps of sinking current via the transconductance amplifier in response to a first offset voltage at an input of the power amplifier and sourcing current via the transconductance amplifier in response to a second offset voltage at the input of the power amplifier;

receiving an input signal at the input of the power amplifier; and saturating the transconductance amplifier in response to the input signal.

19. The method of claim 18, wherein the saturating step is performed such that a gain of the power amplifier to the input signal is substantially unaffected by the transconductance amplifier.

20. The method of claim 18, further comprising the step of controlling a quiescent current of the power amplifier, wherein the controlling step comprises the step of providing, to the transconductance amplifier, current that is independent of the input signal.

21. The power amplifier of claim 1, wherein the input stage has differential input transistors comprising a first transistor and a second transistor, wherein the power amplifier further comprises a current mirror stage coupled to the input stage and the output stage, the current mirror stage comprising a third transistor and a fourth transistor, wherein a drain of the first transistor is coupled to a drain of the third transistor, wherein a drain of the second transistor is coupled to a drain of the fourth transistor, and wherein a gate of the third transistor is coupled to a gate of the fourth transistor, and wherein the drain of the third transistor is coupled to the gate of the third transistor and the gate of the fourth transistor.

22. The power amplifier of claim 21, wherein the transconductance amplifier has an output connection coupled to the drain and the gate of the third transistor.

23. The power amplifier of claim 21, wherein the transconductance amplifier has an output connection coupled to the drain of the second transistor and the drain of the fourth transistor.

24. The power amplifier of claim 2, wherein the transconductance amplifier is configured to saturate in response to a differential input signal received by the input stage.

25. The power amplifier of claim 3, further comprising a current mirror stage coupled to the transconductance amplifier, the input stage, and the output stage.

26. The power amplifier of claim 12, further comprising a current mirror stage coupled to the transconductance amplifier, the input stage, and the output stage.

27. The power amplifier of claim 15, further comprising a current mirror stage coupled to the transconductance amplifier, the differential input transistors, and the output transistor.

* * * * *